(12) United States Patent
Ji et al.

(10) Patent No.: US 9,559,248 B2
(45) Date of Patent: Jan. 31, 2017

(54) LASER SOLDERING SYSTEMS AND METHODS FOR JOINING CRYSTALLINE SILICON SOLAR BATTERIES

(71) Applicant: Sharesun Co., Ltd., Suzhou, Jiangsu (CN)

(72) Inventors: Jingjia Ji, Shanghai (CN); Fan Zhu, Jiangsu (CN); Yusen Qin, Jiangsu (CN)

(73) Assignee: Sharesun Co., Ltd. (CN)

( * ) Notice: Subject to any disclaimer, the term of this patent is extended or adjusted under 35 U.S.C. 154(b) by 0 days.

(21) Appl. No.: 14/894,057

(22) PCT Filed: May 14, 2014

(86) PCT No.: PCT/CN2014/077421
§ 371 (c)(1),
(2) Date: Nov. 25, 2015

(87) PCT Pub. No.: WO2014/190854
PCT Pub. Date: Dec. 4, 2014

(65) Prior Publication Data
US 2016/0118530 A1    Apr. 28, 2016

(30) Foreign Application Priority Data
May 26, 2013    (CN) .......................... 2013 1 0198021

(51) Int. Cl.
*H01L 31/18*    (2006.01)
*H01L 31/048*    (2014.01)
(Continued)

(52) U.S. Cl.
CPC ......... *H01L 31/1876* (2013.01); *H01L 31/048* (2013.01); *H01L 31/0488* (2013.01);
(Continued)

(58) Field of Classification Search
CPC .... H01L 31/048; H01L 31/18; H01L 31/0488; H01L 31/049; H01L 31/022425; H01L 31/022433; H01L 31/1876; H01L 31/188; H01L 31/0504; B32B 37/10; B32B 37/1009; B32B 17/10871; Y02E 10/50
See application file for complete search history.

(56) References Cited

U.S. PATENT DOCUMENTS 6,660,556 B2 * 12/2003 Hashimoto ....... B32B 17/10587
136/244
2011/0005066 A1 *  1/2011 Crofoot ................. B32B 37/003
29/623.5
(Continued)

FOREIGN PATENT DOCUMENTS

WO    WO2014/190854 A1    12/2014
*Primary Examiner* — Michael Trinh

(57) ABSTRACT

The disclosure includes a laser soldering method of connecting crystalline silicon solar batteries. Methods can include placing conductive soldering strips and crystalline silicon solar batteries on a lower press plate and aligning the conductive soldering strips on metal electrodes of crystalline silicon solar batteries. Methods can also include placing an upper press plate on the conductive soldering strips and the crystalline silicon solar batteries and vacuuming between the upper and lower press plates such that absolute pressure between the upper and lower press plates is less than atmospheric pressure. Methods can also include laser soldering the conductive soldering strips and the crystalline silicon solar batteries.

8 Claims, 3 Drawing Sheets

(51) Int. Cl.
*H01L 31/05* (2014.01)
*B32B 37/10* (2006.01)
(52) U.S. Cl.
CPC ...... *H01L 31/0504* (2013.01); *H01L 31/0508* (2013.01); *H01L 31/0516* (2013.01); *H01L 31/188* (2013.01); *B32B 37/1009* (2013.01); *Y02E 10/50* (2013.01); *Y02P 70/521* (2015.11)

(56) References Cited

U.S. PATENT DOCUMENTS

| | | | | |
|---|---|---|---|---|
| 2011/0031225 A1* | 2/2011 | No | ................... | H01L 31/022425 219/121.64 |
| 2012/0132251 A1 | 5/2012 | Sedlacek et al. | | |
| 2012/0312358 A1* | 12/2012 | Yamashita | ............ | H01L 31/048 136/251 |
| 2013/0104957 A1* | 5/2013 | Koyuncu | .............. | H01L 21/268 136/244 |

* cited by examiner

LASER SOLDERING SYSTEMS AND METHODS FOR JOINING CRYSTALLINE SILICON SOLAR BATTERIES

CROSS-REFERENCE TO RELATED APPLICATIONS

This application claims the benefit of Chinese Patent Application Serial No. 201410346346.7; filed Nov. 17, 2014; and entitled Laser Welding Method for Connecting Crystalline Silicon Solar Cells; the entire contents of which are incorporated herein by reference.

FIELD OF INVENTION

The invention relates to a method of manufacturing crystalline silicon solar battery modules, and more particularly, to a method of connecting crystalline silicon solar batteries.

BACKGROUND

The prior art method of manufacturing crystalline silicon solar battery module includes connecting the crystalline silicon solar batteries in parallel or series by a conductive soldering strip. Prior art methods then encapsulation the connected crystalline silicon solar batteries in front and rear module panels by hot-pressing them together so as to meet the requirement of windproof, dustproof, moisture proof, and corrosion resistance in the process of using crystalline silicon solar battery modules.

However, due to the difference of the thermal expansion coefficient, crystalline silicon solar battery will exhibit different bending degrees and can cause great difficulties in the production of crystalline silicon solar battery modules after the electrodes of crystalline silicon solar battery are soldered to the conductive soldering strip. More seriously, under pressure from the conductive soldering strip, the crystalline silicon solar battery can crack easily, and sometimes in hidden places of micro-cracks after the connection and reduce the photoelectric conversion efficiency of crystalline silicon solar battery module.

One remedy to solve the problems described above is to reduce the thickness of the conductive soldering strip. The conductive soldering strip can become softer with reduced thickness; therefore, the micro-cracks and bending problem of crystalline silicon solar batteries can be improved after being soldered to conductive soldering strip.

Unfortunately, after reducing the thickness of the conductive soldering strip, the effective conduction area of the conductive soldering strip can decrease accordingly and cause an increase of series resistance of crystalline silicon solar battery modules. This can even result in the power loss from crystalline silicon solar batteries to the crystalline silicon solar battery module. In the production of crystalline silicon solar battery modules, the loss of photoelectric conversion efficiency from the crystalline silicon solar batteries to the crystalline silicon solar battery module is between about 3-5%. With the increase of photoelectric conversion efficiency of crystalline silicon solar batteries, especially with the increase of short-circuit current of crystalline silicon solar batteries, the loss of photoelectric conversion efficiency from the crystalline silicon solar batteries to the crystalline silicon solar battery module tends to be more serious.

A solution to the loss of photoelectric conversion efficiency from the crystalline silicon solar batteries to the crystalline silicon solar battery module is to replace the conventional heat soldering technology with laser soldering technology. Compared with traditional soldering technology, laser soldering technology has advantages of short heating time, precise control of heat input and small heat affected zone, which effectively avoids the micro-cracks and bending problems of crystalline silicon solar batteries caused by the difference of thermal expansion coefficient. Therefore, after adopting laser soldering technology, the thickness of conductive soldering strip can be increased so as to effectively reduce the efficiency loss of photoelectric conversion from the crystalline silicon solar batteries to the crystalline silicon solar battery module.

One condition of soldering the conductive soldering strip to the crystalline silicon solar battery is that the conductive soldering strip may have to be contact physically to the electrodes of crystalline silicon solar battery. The purpose of this contact is to transfer the heat on the conductive soldering strip to the electrodes of the crystalline silicon solar battery as quickly as possible so that the molten alloy can wet; then cool and solidify on the electrodes of the crystalline silicon solar battery. In the end, the conductive soldering strip can be soldered with the crystalline silicon solar battery.

Because laser soldering is a type of non-contact soldering, the method can be achieved when the physical contact between the conductive soldering strip and the crystalline silicon solar battery can be made, which may be the key point of adopting laser soldering technology to solder crystalline silicon solar batteries. The patent application CN101884114A disclosed a method to tightly contact the conductive soldering strip to the electrodes of crystalline silicon solar battery. However, the surfaces of the conductive soldering strip and the electrodes of crystalline silicon solar battery are not very smooth. As a consequence, the conductive soldering strip failed to contact tightly to the electrodes of crystalline silicon solar battery in some local areas and affected the reliability of laser soldering.

Due to the problems described above, laser soldering technology remains in the laboratory research stage and has not been applied in production of crystalline silicon solar battery module.

SUMMARY OF INVENTION

The disclosure provides a laser soldering technology to manufacture crystalline silicon solar battery modules. As well, the disclosure provides a method, which enables the conductive soldering strip to tightly contact to the electrodes of crystalline silicon solar battery.

This method can ensure that the pressure at every point on the conductive soldering strip is consistent, ultimately ensuring that every point on the conductive soldering strip has a good and uniform contact with the electrodes of crystalline silicon solar battery.

The disclosure also provides a method to produce crystalline silicon solar battery modules. This method can help to reduce the number of movements in the manufacturing process of crystalline silicon solar battery modules to thereby lower the risk of micro-cracks in the process of moving crystalline silicon solar battery.

As well, the disclosure provides a method to produce crystalline silicon solar battery modules, which can greatly simplify the operation steps and improve the production efficiency of crystalline silicon solar battery module.

In order to achieve the objectives above, the disclosure provides a method to manufacture the crystalline silicon solar battery module using laser soldering technology to connect the crystalline silicon solar batteries to manufacture crystalline silicon solar battery module. In the method, vacuum can be made between the upper and lower press plates such that the atmospheric pressure imposed on the conductive soldering strips (commonly referred to as ribbon) is evenly and uniformly distributed through the upper and lower press plates. This can enable the conductive soldering strip to tightly contact to the electrodes of crystalline silicon solar battery. Afterwards, the crystalline silicon solar batteries can be connected to the crystalline silicon solar battery module in series or in parallel, or series-parallel connection by laser soldering technology.

The invention utilizes the characteristic that atmospheric pressure is uniform and consistent at any point in the pressure area. For example, the pressure is uniform through a solid sheet or solid sheet layer, such as solid sheet made of rigid material, or the solid sheet made of elastic material, or overlapped layers of the two materials, imposing pressure evenly and uniformly on the surface of conductive soldering strips to ensure uniform and strong physical contact at any point between surface of a conductive soldering strip and the electrode surface of the crystalline silicon solar battery. Therefore, this can achieve the objective of soldering the conductive soldering strip to the electrodes of crystalline silicon solar batteries. The uniform and strong physical contact can ensure that the heat received from laser energy on the conductive soldering strip can be transferred rapidly to the contacted electrodes of crystalline silicon solar battery. This can enable the low melting temperature alloy on the conductive soldering strip to wet, then cool and solidify on the electrodes of crystalline silicon solar battery so as to complete the laser soldering steps effectively.

The disclosure can also provide a method to connect crystalline silicon solar batteries by laser soldering. This method can adopt laser soldering technology to connect the crystalline silicon solar batteries of the crystalline silicon solar battery in series, parallel or series-parallel connection through the conductive soldering strip.

An advantage of the invention is that the method of imposing pressure can ensure uniform pressure at any point on the conductive soldering strips in the crystalline silicon solar battery module. Accordingly, there can be no pressure difference at any point on the conductive soldering strip. The pressuring method of the invention may be one of the key points to ensure the application of laser soldering technology in the production of crystalline silicon solar battery modules. Due to the non-flat surfaces of both the conductive soldering strip and the electrodes of crystalline silicon solar batteries, the pressure imposed on the conductive soldering strip can be particularly important. The uneven pressure may cause too high pressure and lead to fractures, or micro-cracking, in crystalline silicon solar batteries. On the contrary, too low pressure may also result in bad contact between the conductive soldering strip and the electrodes of crystalline silicon solar battery and affect the quality of laser soldering.

Another advantage of the systems and methods described in this disclosure is that the pressuring method of the invention can be capable of imposing pressure to all the conductive soldering strips in one crystalline silicon solar battery module at one time. Namely, the pressuring method of the invention can allow all the conductive soldering strips to be soldered in one module to contact tightly to the electrodes of crystalline silicon solar batteries. Compared with other pressuring methods, the invention not only simplifies the pressuring operation steps, but can also enable the pressure imposed on all the conductive soldering strips to be uniform to effectively ensure the soldering quality at every soldering point.

Furthermore, the pressuring method of conductive soldering strips in the invention may not be restricted by area. As well, the pressuring method in the invention may impose pressure on all of the conductive soldering strips, which may need to be soldering in a whole crystalline silicon solar battery module simultaneously. Therefore, another advantage of the invention is avoiding the crystalline silicon solar batteries from moving during the production process of crystalline silicon solar battery modules. The laser soldering technology in the invention can achieve a one-time soldering for all of the crystalline silicon solar batteries in one crystalline silicon solar module and the corresponding conductive soldering strips. After the implementation of the laser soldering in the invention, the crystalline silicon solar battery module can be encapsulation directly by hot-pressing steps, which can greatly improve the production efficiency of crystalline silicon solar battery module.

As well, the laser soldering technology described in the disclosure can realize a one-time soldering between all of the crystalline silicon solar batteries in one crystalline silicon solar module and the corresponding conductive soldering strips to thereby avoid the risk of micro-cracks generated in repeated movement of crystalline silicon solar batteries. Therefore, another advantage of the invention is that the method of manufacturing crystalline silicon solar battery module in the invention can be capable of adopting thicker conductive soldering strips. Therefore, after using the thicker conductive soldering strips, the series resistance of crystalline silicon solar battery module can be reduced. As well, the power loss from the crystalline silicon solar batteries to the crystalline silicon solar battery module can be reduced and the output power of crystalline silicon solar battery can be increased accordingly.

The laser soldering method of the invention may not only allow use of thicker conductive welding strips but also may allow using the lead-free conductive soldering strips to manufacture solar battery modules. Compared with lead-content conductive soldering strips, the lead-free conductive soldering strips can require higher soldering temperature. Meanwhile, due to the poor liquidity and easy oxidization of lead-free tin alloy, the conventional soldering method can be difficult to use a lead-free conductive soldering strip. Accordingly, the laser soldering method of the invention can enable a uniform connection between the conductive soldering strip and the electrodes of crystalline silicon solar batteries, which can improve the heat transmission between the conductive soldering strip and the metal electrodes of the solar battery to thereby solve the poor liquidity problem of the lead-free conductive soldering strip. As well, the laser soldering method of the invention can be implemented under the vacuum condition, which can effectively solve the problems of easy oxidation of lead-free soldering tin. Therefore, by implementing laser soldering, even if a lead-free conductive soldering strip is used, the temperature of the laser welding can be reduced to the minimum.

The laser soldering method of manufacturing crystalline silicon solar battery modules in the invention can be applicable for a vast majority of crystalline silicon solar batteries, especially for those sensitive to soldering temperature. Due to the laser soldering technology, the heated crystalline silicon solar batteries can be confined to a limited heating area and a very short heating time. Accordingly, the characteristics of photoelectric conversion of those crystalline silicon solar batteries sensitive to welding temperature may not be damaged after laser soldering.

DETAILED DESCRIPTION

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

Figure 1:
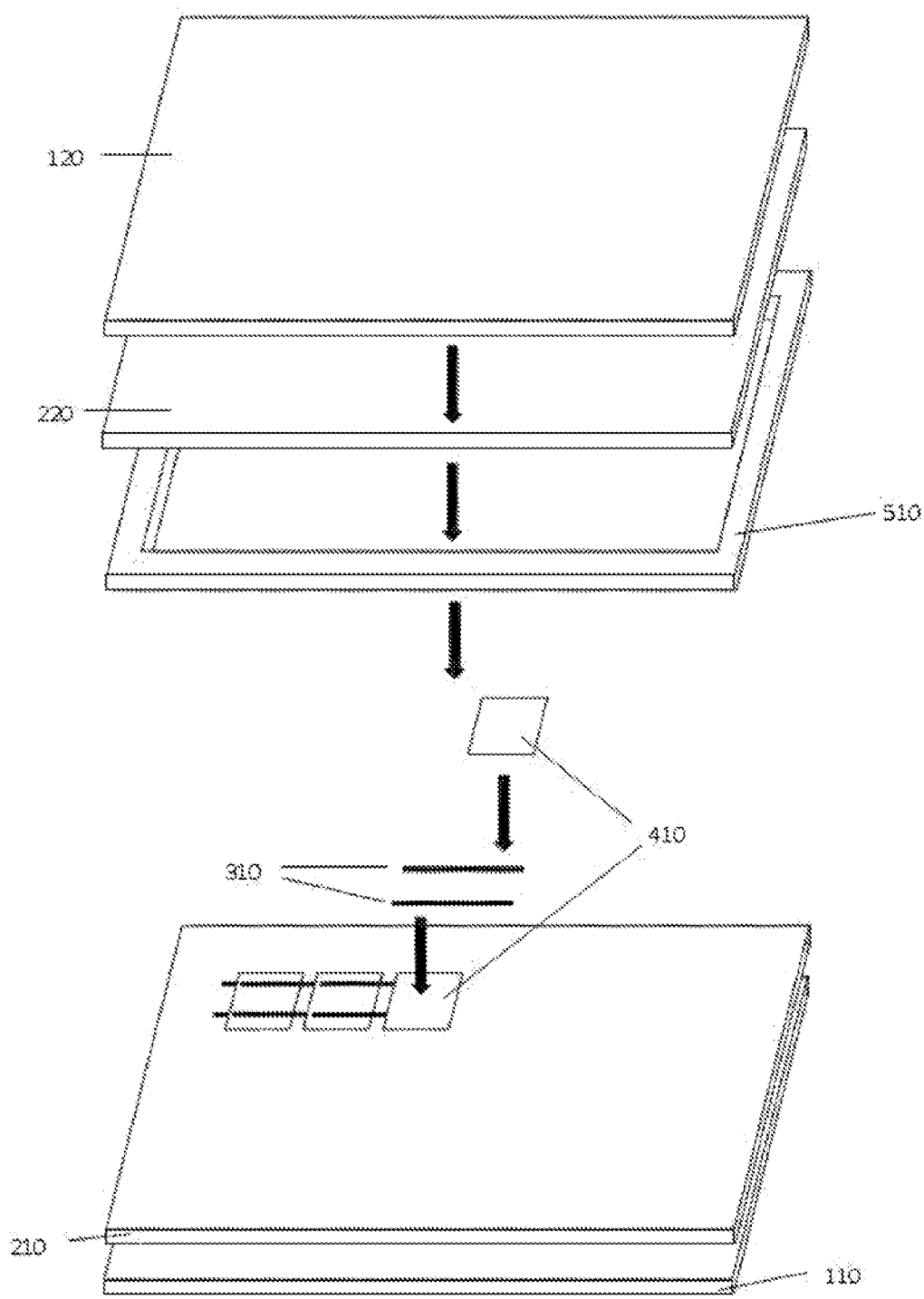
FIG. 1 illustrates a schematic diagram of the crystalline silicon solar battery module with double-sided electrodes, according to some embodiments.

The method of manufacturing the crystalline silicon solar battery modules described in this disclosure is to make the absolute pressure between the upper press plate and the lower press plate less than atmospheric pressure, thus relying on the outside atmospheric pressure of the upper and lower press plates to tightly contact the conductive soldering strip to the electrodes of crystalline silicon solar battery module in the same two press plates. In the embodiment of FIG. 1, the upper press plate and the lower press plate may comprise a rigid-material solid sheet and an elastic-material solid sheet.

Referring to FIG. 1, in accordance with the sequence, the rigid-material solid sheet in the lower press plate 110 can first be placed on the worktable. According to different requirements and applications, the worktable can be horizontal or can be tilted in a certain angle. In some embodiments, the preferred worktable of the invention should be suitable for the implementation of laser soldering. As such, after placing all the materials required by a solar battery module in the invention, the laser soldering steps in the invention can be implemented directly.

The rigid-material solid sheet 110 in the lower press plate can be laser-penetrated or non-laser penetrated layer. In some embodiments, the rigid-material solid sheet 110 in the lower press plate in the invention is glass or laser-penetrated polymer plastic. Furthermore, the rigid-material solid sheet 110 in the lower press plate preferred in the invention can be one of the front-panels of the crystalline silicon solar battery module, e.g. glass. By choosing one front-panel of the crystalline silicon solar battery module as the rigid-material solid sheet 110 in the lower press plate, after the implementation of laser soldering steps in the invention, the soldered crystalline silicon solar battery module can be encapsulated by a hot pressing method. This can simplify the production process of the crystalline silicon solar battery and avoid the micro-cracking risk of the crystalline silicon solar battery.

Accordingly, in this embodiment, except for the rigid-material solid sheet 110, the lower press plate can also include a layer of elastic-material solid sheet 210. Namely, the lower press plate can consist of one layer of rigid-material solid sheet and another layer of elastic-material solid sheet. By placing a layer of elastic-material solid sheet 210 on the rigid-material solid sheet 110 in the lower press plate, in the subsequent vacuuming steps, the pressure imposed on the conductive soldering strip 310 under the action of the rigid-material solid sheet 110 in the lower press plate can be more uniform due to the elastic property of the elastic-material solid sheet 210. In some embodiments, the elastic-material solid sheet 210 in the invention can adopt the encapsulation material of the crystalline silicon solar battery module. If the elastic-material solid sheet 210 adopts the encapsulation material of the crystalline silicon solar battery module, e.g. polyethylene vinyl acetate (EVA) and polyvinyl butyral (PVB), etc., after the implementation of the laser soldering method, the soldered crystalline silicon solar battery module can be directly encapsulated by a hot pressing method. This method can simplify the production process of crystalline silicon solar battery and avoid the risk of micro-cracks in the crystalline silicon solar battery.

As shown in FIG. 1, after placing the lower press plate, namely, placing the rigid-material solid sheet 110 and the elastic-material solid sheet 210 one after another, the conductive soldering strip 310 can be prepared for the crystalline silicon solar battery module. The crystalline silicon solar battery 410 can be placed on the lower press plate one by one. In some situations, by first placing the conductive soldering strip 310 on the lower press plate, the position of the conductive soldering strip 310 in the lower press plate should follow the position of the electrodes of crystalline silicon solar battery 410. Then the method can include placing the crystalline silicon solar battery 410 on the conductive soldering strip 310 and aligning the electrodes of crystalline silicon solar battery 410 against the conductive soldering strip 310. Then the method can include repeating the placement of conductive soldering strip 310 and crystalline silicon solar battery 410 continually until all of the crystalline silicon solar battery 410 and corresponding conductive soldering strip 310 are placed on the lower press plate. As required, the conductive soldering strips 310 and crystalline silicon solar batteries 410 can be arranged in series connection or series-parallel connection. In some embodiments, the quantity of crystalline silicon solar battery 410 in the invention should be equal to the total number of batteries in the module. Therefore, by placing all of the crystalline silicon solar batteries 410 and all of the conductive soldering strips 310 to connect the crystalline silicon solar battery 410 on the lower press plate, the laser soldering method in the invention can continuously complete the soldering task of all crystalline silicon solar batteries 410 in the module at once.

In some embodiments, the conductive soldering strip 310 can be fixed on the electrodes of crystalline silicon solar battery 410 in advance, then place the conductive soldering strip 310 and the crystalline silicon solar battery 410 on the lower press plate one by one. This method is capable of reducing the difficulty of aligning the conductive soldering strip 310 against the electrodes of crystalline silicon solar battery 410.

The conductive soldering strip 310 used in the invention can be a kind of conductive material with the outer surface of copper strip coated by a layer of low-melting temperature alloy, e.g. tin-bearing alloy. It should be appreciated that any conductive soldering strip of the crystalline silicon solar battery sold in the market can be used as the conductive soldering strip 310 in the invention. In some embodiments, the low-melting temperature alloy coated on the conductive soldering strip is a lead-free low-melting temperature alloy, e.g. lead-free tin alloy.

As well, in some embodiments, the crystalline silicon solar battery 410 can be a conventional screen-printing crystalline silicon solar battery. According to the design of conventional screen-printing crystalline silicon solar battery, the positive and negative electrodes can be distributed on the each surface of the solar battery.

Furthermore, in some embodiments of the invention, the crystalline silicon solar battery 410 can be a double-sided battery. Different from the conventional screen-printing battery, the reverse side of the double-sided crystalline silicon solar battery can adopt passivation technology to replace the conventional Back Surface Field technology. When the reverse side of the double-sided crystalline silicon solar battery receives the light, the light energy received can also be converted to DC electric energy.

According to some embodiments, when placing the crystalline silicon solar battery 410, the light-facing side can be placed downward. However, in other embodiments of the invention, the light-facing side of the crystalline silicon solar battery 410 can also be placed upward. In some embodiments, by placing the light-facing side of the crystalline silicon solar battery 410 downward, this can be more beneficial for manufacturing the crystalline silicon solar battery module.

As shown in FIG. 1, all of the crystalline silicon solar batteries 410 and conductive soldering strips 310 that need to be soldered are placed on the lower press plate, and then the sealing ring 510 and the upper press plate can be placed in sequence on the elastic-material solid sheet 210. The function of the sealing ring 510 is to keep the vacuum degree between the upper and lower press plates in the laser soldering method of connecting the conductive soldering strip 310 and the crystalline silicon solar battery 410 in the invention. It should be appreciated that the material of the sealing ring 510 can be any type of commercial elastic sealing material.

In some embodiments, the sealing ring 510 can be fixed directly on the upper press plate. An advantage of fixing the sealing ring 510 directly on the upper press plate is that, when the upper press plate is not used as an outer plate of the crystalline silicon solar battery module, the outer plate of the crystalline silicon solar battery module can be replaced conveniently before hot-pressing encapsulation. This can simplify the outer plate replacing steps of the crystalline silicon solar battery module.

Similar to the lower press plate, referring to FIG. 1, in this embodiment, the upper press plate can be composed of one layer of elastic-material solid sheet 220 and another layer of rigid-material solid sheet 120. The function of the elastic-material solid sheet 220 covering on the crystalline silicon solar battery 410 and conductive soldering strip 310 can be similar to the elastic-material solid sheet 210. In other words, the elastic property of the elastic-material solid sheet 220 can ensure the pressure imposed on the conductive soldering strip 310 is more even and uniform under the action of the upper press plate. In some embodiments, the elastic-material solid sheet 220 can adopt the encapsulation material of crystalline silicon solar battery module, e.g. polyethylene vinyl acetate (EVA) and polyvinyl butyral (PVB), etc. The advantage of using the encapsulation material of crystalline silicon solar battery module as the elastic-material solid sheet 220 is that the soldered crystalline silicon solar battery module can be directly encapsulated by a hot pressing method, which can simplify the production process of crystalline silicon solar battery and avoid the risk of micro-cracks in the crystalline silicon solar battery.

According to the design and production process of various crystalline silicon solar battery modules, the rigid-material solid sheet 120 in the invention can be laser-penetrated outer plate or non-laser-penetrated outer plate. The rigid-material solid sheet 120 can be glass or other transparent polymer plastics. In some embodiments of the invention, the rigid-material solid sheet 120 directly adopts one outer plate of the crystalline silicon solar battery module. In these embodiments, after implementation of the laser soldering method in the invention, the soldered crystalline silicon solar battery module can be directly encapsulated by a hot-pressing method, which can greatly simplify the production process of the crystalline silicon solar battery module.

Furthermore, any number of layers and the material of the solid sheet in the upper and lower press plates can be used in the design and specific manufacturing condition of the crystalline silicon solar battery module. For instance, in some embodiments, the upper press plate is not made up of the elastic-material solid sheet and the rigid-material solid sheet but adopts only one rigid-material solid sheet as the upper press plate, e.g. adopting a layer of glass as the upper press plate to meet the requirements of design and manufacturing condition of various crystalline silicon solar battery modules.

After completing the placement of the upper press plate, the laser soldering steps of soldering the conductive soldering strip 310 and the crystalline silicon solar battery 410 can be implemented. One of the technologies of soldering the conductive soldering strip 310 and the crystalline silicon solar battery 410 by laser soldering is, through a vacuuming method between the two press plates, to enable the absolute pressure between the two press plates to be less than the atmospheric pressure. Utilizing the pressure difference between the two press plates and the atmospheric pressure, through the upper and lower press plates, can impose the pressure on the conductive soldering strip 310 in the middle of the upper and lower press plates evenly and uniformly. This can ensure the conductive soldering strip 310 contacting tightly to the electrodes of the crystalline silicon solar battery 410 and thereby implementing the laser soldering steps of soldering the conductive soldering strip 310 and the crystalline silicon solar battery 410 in the invention.

Figure 2:
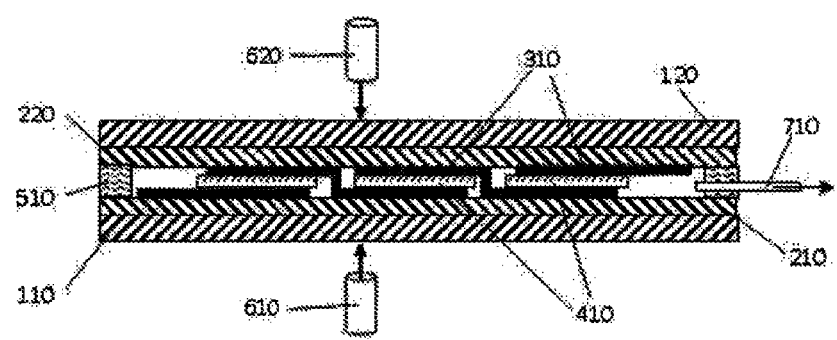
FIG. 2 illustrates a sectional view of a method of producing vacuum between the upper and lower press plates and implementing the laser soldering, according to some embodiments.

Referring to FIG. 2, before implementing the laser soldering steps of soldering the conductive soldering strip 310 and the crystalline silicon solar battery 410 in the invention, a part of the air between the two press plates can be exhausted from the air outlet 710 so as to cause the absolute pressure between the upper and lower press plates to be lower than the outside atmospheric pressure. Under the action of the outside atmospheric pressure, the upper and lower two rigid-material solid sheet 120 and 110 impose the pressure uniformly to all of the conductive soldering strips 310 between the upper and lower two rigid-material solid sheet 120 and 110 through the upper and lower two elastic-material solid sheet 210 and 220. This can enable all of the conductive soldering strips 310 between the upper and lower rigid-material solid sheet 120 and 110 to contact tightly to the electrodes of crystalline silicon solar battery 410. As well, this can ensure the equal pressure at any point on the conductive soldering strip 310.

Due to the uniformity of the atmospheric pressure, the method of making the absolute pressure between the upper and lower press plates to be less than the outside atmospheric pressure can ensure the whole area of the crystalline silicon solar battery, no matter if only one or many crystalline silicon solar battery 410 exist in the area. Therefore, the pressure imposed to any point on all of the conductive soldering strips 310 should be the same. Namely, in the whole area of the crystalline silicon solar battery module, all of the conductive soldering strips 310 can contact tightly to the electrodes of crystalline silicon solar battery 410 under the same pressure. The method imposing pressure to the conductive soldering strip 310 in the invention can be capable of solving the non-uniformity problem of local pressure and avoiding the risk of micro-crack of the crystalline silicon solar battery 410 caused by too high local pressure. As well, this can effectively prevent the non-effective soldering phenomenon caused by too low pressure.

Another advantage of laser soldering the conductive soldering strip 310 to the crystalline silicon solar battery 410 is that it can impose pressure to all the conductive soldering strips 310 and the crystalline silicon solar batteries 410 simultaneously. Namely, as soon as the vacuum is made between the upper and lower press plates in the laser soldering method of the invention, then all of the conductive soldering strips 310 between the upper and lower press plates will bear a same pressure. Compared with the local pressuring method, the pressuring method of the invention can greatly simplify the pressuring operation of the conductive soldering strip 310 during the laser soldering process, which can be more beneficial for the mass production.

In order to keep the conductive soldering strip 310 tightly contact to the electrodes of the crystalline silicon solar battery 410, namely, keeping the vacuum degree between the upper and lower press plates, and then implementing the laser soldering steps of the invention, the disclosure includes continuous vacuuming to keep the vacuum degree between the upper and lower press plates. In other embodiments of the invention, a sealing valve can be installed in the air outlet 710 so that the vacuum degree between the upper and lower press plates can be kept when the sealing valve is closed. In these embodiments, the vacuuming worktable and the laser soldering worktable can be separated, which can enable the manufacturing method of the crystalline silicon solar battery module to become more flexible.

In the soldering method described, the conductive soldering strip 310 can be tightly contact to the electrodes of the crystalline silicon solar battery 410, which can ensure the heat energy converted from the laser energy received by the conductive soldering strip 310 to be transferred rapidly to the electrodes of crystalline silicon solar battery 410 during the laser soldering process. Therefore, the low-temperature molten alloy outside the conductive soldering strip 310 can wet the electrodes of the crystalline silicon solar battery 410, then cool and solidify on the electrodes of the crystalline silicon solar battery 410 so as to effectively complete the laser soldering connection as described.

The laser soldering method of the invention can adopt the upper laser 620 or the lower laser 610 to implement the laser soldering steps of the upper and lower surfaces respectively. In some embodiments, it can only adopt the upper laser 620 or the lower laser 610 to implement the laser soldering. In these embodiments, if the radiation energy of the laser is sufficient, the conductive soldering strips 310 contact tightly to the positive and negative metal electrodes of the crystalline silicon solar battery 410 can be heated simultaneously. Therefore, the laser soldering method of soldering the conductive soldering strip 310 to the positive and negative metal electrodes of the crystalline silicon solar battery 410 can be realized by only one laser beam.

In some embodiments, in order to reduce the heat damage to the crystalline silicon solar battery 410, the radiation energy of the laser can be reduced to ensure that the soldering between the conductive soldering strip 310 and the crystalline silicon solar battery 410 only happens on the side irradiated by the laser, but no soldering phenomenon happens between the conductive soldering strip 310 on the other side of the solar battery 410 and the electrodes of the crystalline silicon solar battery 410. After completing the laser soldering of the conductive soldering strip 310 and the electrodes of crystalline silicon solar battery 410 on one side, the method can include implementing the laser soldering on the other side of the crystalline solar battery 410.

The laser soldering method disclosed can use the upper laser 620 and the lower laser 610 to implement the laser soldering of the corresponding electrodes on the front and backside of the crystalline silicon solar battery 410 simultaneously. Under the condition of using only one laser beam to implement the laser soldering, due to the other side of the soldering point being under the room temperature, the soldering temperature must be raised to meet the soldering requirement so as to heat the electrodes of the crystalline silicon solar battery 410. In the event that there is a temperature difference between the front and back side, this laser soldering method may lead to higher thermal stress on the crystalline silicon solar battery 410 and cause the micro-cracks in the crystalline silicon solar battery 410. After adopting the optimized method of the invention, the upper laser 620 and the lower laser 610 implement the laser soldering of the two sides of the specific points on the crystalline silicon solar battery 410 simultaneously, reducing the temperature gradient between the electrodes of the crystalline silicon solar battery 410 and the conductive soldering strip 310, meanwhile, reducing the temperature gradient inside the crystalline silicon solar battery 410. Therefore, the thermal stress generated in the laser soldering process in the crystalline silicon solar battery 410 can be reduced effectively and the micro-cracks in the crystalline silicon solar battery 410 can be avoided. In some embodiments, it may also change the beam angle of the upper laser 620 and the lower laser 610, namely, not irradiating vertically but obliquely to a certain point on the conductive welding strip 310 simultaneously, completely avoiding the laser 620 and 610 to irradiate to each other.

By implementing the laser soldering of the invention, it may move laser 610 and 620 or move the worktable to solder all the points which need to be soldered on the module. Moreover, it may move the laser 610 and 620 and the worktable simultaneously or respectively to solder all the points which need to be soldered on the module. The advantage of moving the laser 610 and 620 and the worktable simultaneously or individually can reduce the moving range of the laser and worktable, which reduces the cost of laser soldering and improves the moving precision of the laser and worktable.

The laser to solder the conductive soldering strip 310 and the crystalline silicon solar battery 410 can be a continuous laser or a pulsed laser. By adopting the continuous laser, a good control of laser power density and laser soldering speed may achieve the purpose of soldering and avoiding too much thermal stress to the battery. As well, adopting the pulsed laser, in addition to the control of the laser power density and laser soldering speed, a good control of laser pulse waveform and laser pulse width may also achieve the soldering purpose.

In some embodiments, the laser adopted to solder the conductive soldering strip 310 and the crystalline silicon solar battery 410 can be a single laser beam that irradiates one time or multiple times. As well, some embodiments can use dual laser beams or multiple laser beams that irradiate together in the soldering area. The purpose may be to control the heating and cooling temperature gradient in the soldering process and reduce the thermal stress damage to the crystalline silicon solar battery and avoid the micro-cracks in the crystalline silicon solar battery. In some embodiments, a soldering point can be heated by one laser beam multiple times. Meanwhile, the light power density, focal plane position and pulse waveform can be different, which can further reduce the thermal stress of the crystalline silicon solar battery.

As well, the laser soldering technique of soldering the conductive soldering strip 310 and the crystalline silicon solar battery 410 in the invention can be laser continuous soldering or laser intermittent point soldering. Adopting laser continuous soldering, the control of the laser speed can be crucial for the efficacy of the soldering. In embodiments adopting laser intermittent point soldering, the duration at a single point will determine the heat input of the soldering process. If the duration is too long, due to excessive heat input, it may cause the breakage of the battery. On the contrary, the heat input may not be enough if the duration is too short.

After completion of the laser soldering, the hot-pressing encapsulation of the module can be directly carried on according to the design structure of the module. In some embodiments, the upper press plate can be replaced by the back panel of the crystalline silicon solar battery module, e.g. TPT back panel. Afterwards, the hot-pressing encapsulation of the module can be carried on.

Figure 3:
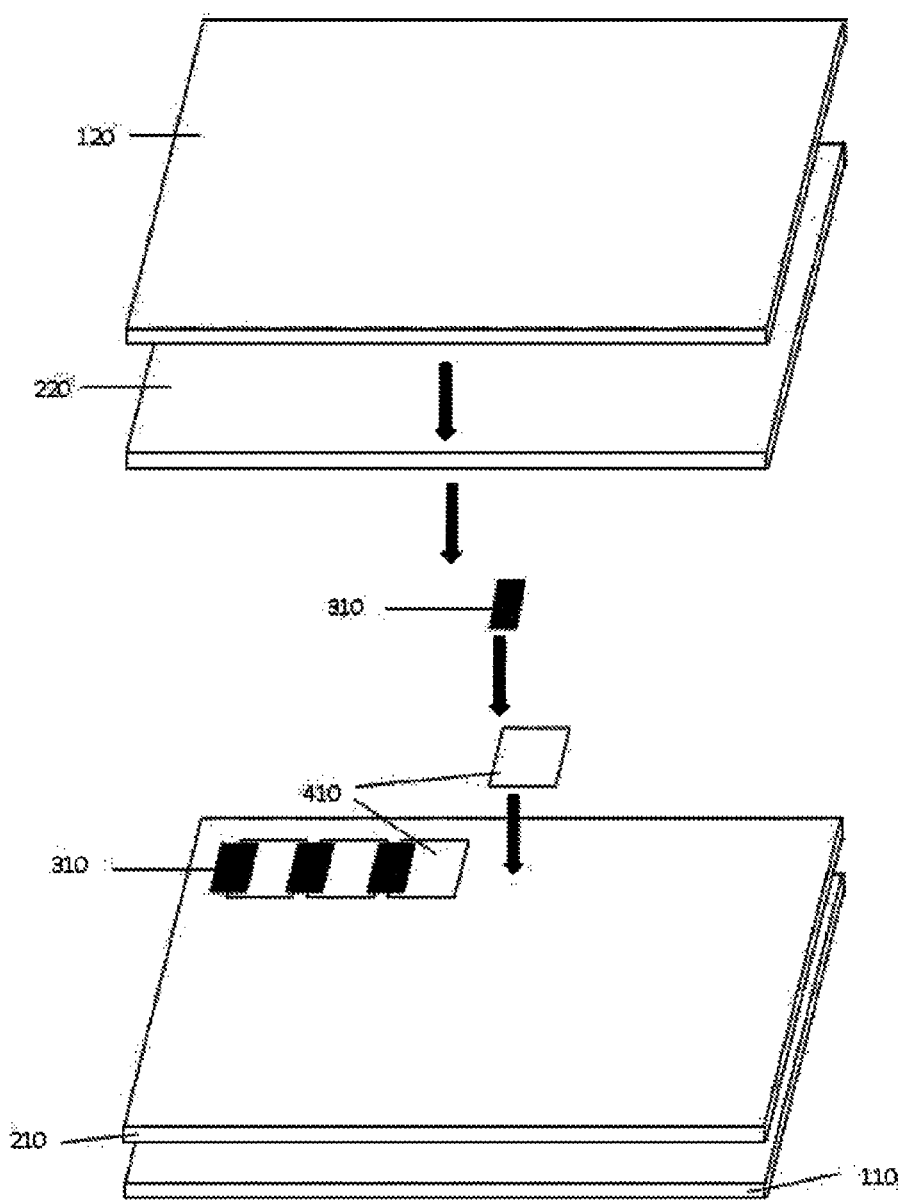
FIG. 3 illustrates a schematic diagram of the crystalline silicon solar battery module with single-side electrode, according to some embodiments.

In some embodiments, as shown in FIG. 3, the crystalline silicon solar battery 410 can be a back-electrode battery whereby the positive and negative electrodes of the crystalline silicon solar battery 410 are not distributed on the front and back side of the crystalline silicon solar battery 410, but are concentrated on the back side of the crystalline silicon solar battery 410. The advantage of back-electrode battery may result in no shadow loss caused by the electrodes.

In accordance with the sequence, the lower press plate may be placed first. In this embodiment, the lower press plate may be overlapped by the rigid-material solid sheet 110 and the elastic-material solid sheet 210. Furthermore, the lower press plate may comprise materials for manufacturing the crystalline silicon solar battery module. For example, the rigid-material solid sheet 110 may be the panel glass of the module and the elastic-material solid sheet 210 may be the encapsulation material of the crystalline silicon solar battery, e.g. polyethylene vinyl acetate (EVA) and polyvinyl butyral (PVB), etc.

As shown in FIG. 3, after placing the lower press plate, the conductive soldering strip 310 and the crystalline silicon solar battery 410 used for manufacturing crystalline silicon solar battery module may be placed on the elastic-material solid sheet 210 one by one. Compared with the battery, which has electrodes distributed on the front and back sides of the crystalline silicon solar battery, placing the positive and negative electrodes on the same side of the crystalline silicon solar battery may be simpler. The method may include placing the crystalline silicon solar battery 410 on the elastic-material solid sheet 210, then placing the conductive soldering strip, and then, repeat placing the crystalline silicon solar battery 410 and conductive soldering strip 310 until all of the crystalline silicon solar batteries 410 and corresponding conductive soldering strips 310 are placed on the elastic-material solid sheet 210. An easier method may be to place the crystalline silicon solar battery 410 and the conductive soldering strip 310 is to place all of the crystalline silicon solar batteries 410 of one solar battery module on the elastic-material solid sheet 210, and then place all of the conductive soldering strips 310 on the electrodes of the crystalline silicon solar batteries 410.

After placing all the crystalline silicon solar battery 410 and the conductive soldering strip 310, that need to be soldered on the elastic-material solid sheet 210, as shown in FIG. 3, then place the upper press plate. The preferred upper press plate of the invention may comprise the elastic-material solid sheet 220 of the encapsulation material of the crystalline silicon solar battery (e.g. polyethylene vinyl acetate (EVA) and polyvinyl butyral (PVB), etc.) and the rigid-material solid sheet 120. The optimized rigid-material solid sheet 120 can be glass or other transparent polymer plastics.

Figure 4:
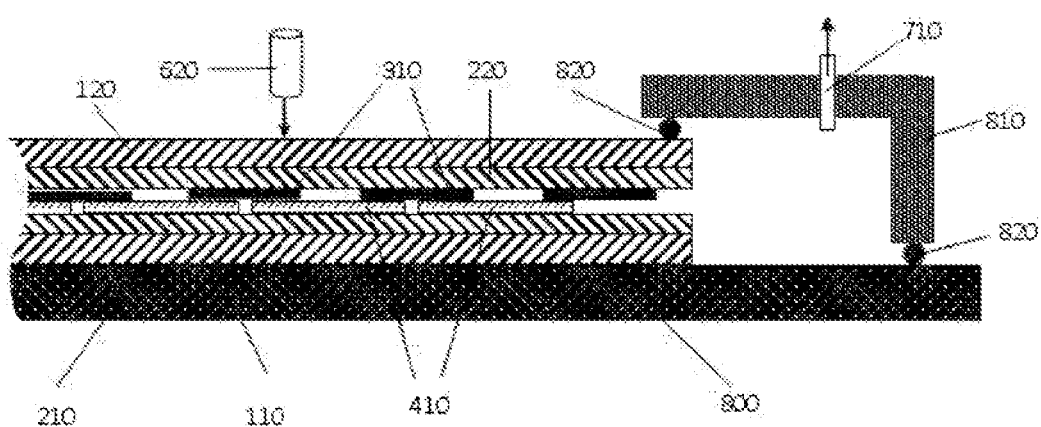
FIG. 4 is a sectional view of a method of producing vacuum between the upper and lower press plates and implementing a single-side laser soldering, according to some embodiments.

After placing the upper press plate, the laser soldering steps of soldering the conductive soldering strip 310 and the crystalline silicon solar battery 410 can be implemented. As shown in FIG. 4, which is different from the embodiment of FIG. 2, this embodiment may adopt a sealing frame 810. The sealing between the sealing frame 810 and the rigid-material solid sheet 120 can be realized through the sealing ring 820. After vacuuming in the sealing frame through the air outlet 710, the absolute pressure inside the sealing frame, or, the absolute pressure between the upper and lower press plates may be less than the outside atmospheric pressure. Under the action of the outside atmospheric pressure, the rigid-material solid sheet 120, through the elastic-material solid sheet 220, may evenly impose the pressure to all of the conductive soldering strips 310 under the elastic-material solid sheet 220. This can enable all of the conductive soldering strips 310 under the elastic-material solid sheet 220 to contact tightly to the electrodes of the crystalline silicon solar battery 410.

As shown in the embodiment of FIG. 4, the real lower press plate of the invention can include the worktable 800, the rigid-material solid sheet 110, and the elastic-material solid sheet 210. In addition to the upper press plate, shown in the embodiment consisting of the elastic-material solid sheet 220 and the rigid-material solid sheet 120, in other embodiments, the upper press plate can directly use a layer of elastic-material solid sheet 220 or a layer of rigid-material solid sheet 120 as the upper press plate.

In the laser soldering method of the invention, the conductive soldering strip 310 can contact tightly to the electrodes of the crystalline silicon solar battery 410, which can ensure that the heat received from laser energy on the conductive soldering strip 310 can be transferred rapidly to the connected electrodes of the crystalline silicon solar battery 410. This can enable the low-temperature molten alloy outside the conductive soldering strip 310 to wet the electrodes of the crystalline silicon solar battery 410, then cool and solidify on the electrodes of the crystalline silicon solar battery 410 so as to complete the laser soldering steps effectively.

In some embodiments, the laser soldering method may adopt the upper laser 620 to implement the laser soldering steps. In the process of implementing the laser soldering of the invention, it may move the laser 620 to solder all the points that need to be soldered on the module. It may also move the worktable 800 to solder all the points that need to be soldered on the module. Moreover, it may move the laser 620 and the worktable 800 simultaneously or separately to solder all the points that need to be soldered on the module. The advantage of moving the laser 620 and the worktable

800 simultaneously or separately is that it may be capable of reducing the moving range of the laser and worktable. This can reduce the cost of laser soldering and improve the moving precision of the laser and worktable.

After completing the laser soldering steps of the invention, the hot-pressing encapsulation of the module can be carried on directly according to the design structure of the module. In some embodiments, the rigid-material solid sheet 120 can be replaced by other back panels (e.g. TPT back panel) and then encapsulation the module by a hot-pressing method.

The invention claimed is:

1. A laser soldering method of connecting crystalline silicon solar batteries, comprising:
    placing conductive soldering strips, crystalline silicon solar batteries, and aligning the conductive soldering strips against electrodes of the crystalline silicon solar batteries in sequence according to design of a crystalline silicon solar battery module on a lower press plate;
    placing the upper press plate on the conductive soldering strips and the crystalline silicon solar batteries;
    vacuuming the space between the upper and lower press plates such that absolute pressure between the upper and lower press plates of the conductive soldering strips and the silicon solar batteries is less than atmospheric pressure; and
    laser soldering the conductive soldering strips and the crystalline silicon solar batteries;
    wherein the lower press plate or the upper press plate further comprising at least one layer of solid sheet or least multiple layers of solid sheets; wherein at least one press plate is laser penetrable; wherein the laser soldering is implemented between the conductive soldering strip and the electrodes of the crystalline silicon solar battery through the press plate; wherein during laser soldering the laser penetrate both the lower press plate and the upper press plate to irradiate on the conductive soldering strips to tightly contact the positive electrode and the negative electrode of the crystalline silicon solar battery, the method further comprising simultaneously implementing the laser soldering conductive soldering strips onto an positive electrode and an negative electrode of the crystalline silicon solar battery.

2. The laser soldering method of claim 1, wherein at least one layer of the solid sheet is made of rigid-material.

3. The laser soldering method of claim 1, wherein at least one layer of the solid sheet is made of elastic-material.

4. The laser soldering method of claim 1, wherein at least one of the lower press plate and the upper press plate further comprising encapsulation materials of the crystalline silicon solar battery module.

5. The laser soldering method of claim 1, wherein the conductive soldering strips and the crystalline silicon solar batteries on the lower press plate are placed one by one such that the quantity of the crystalline silicon solar batteries is at least two.

6. The laser soldering method of claim 5, wherein the conductive soldering strips and the crystalline silicon solar batteries on the lower press plate are placed one by one such that all of the crystalline silicon solar batteries required in one crystalline silicon solar battery module and the corresponding soldering strips on the lower press plate are placed in sequence.

7. The laser soldering method of claim 1, wherein the laser soldering implements at least a partial soldering of crystalline silicon solar batteries in the crystalline silicon solar battery module wherein the conductive soldering strip contacts tightly to electrode of the crystalline silicon solar battery.

8. The laser soldering method of claim 1, wherein the laser soldering implements a complete soldering of crystalline silicon solar batteries in the crystalline silicon solar battery module wherein the conductive soldering strip contacts tightly to the electrode of crystalline silicon solar battery.

* * * * *